US012780043B2

(12) United States Patent
Weston et al.

(10) Patent No.: US 12,780,043 B2
(45) Date of Patent: Nov. 3, 2026

(54) TEMPERATURE CONTROL FOR ELECTRIC VEHICLE COMPONENTS WHILE PARKED

(71) Applicant: FORD GLOBAL TECHNOLOGIES, LLC, Dearborn, MI (US)

(72) Inventors: Keith Weston, Canton, MI (US); Stuart C. Salter, White Lake, MI (US); Brendan F. Diamond, Grosse Pointe, MI (US)

( * ) Notice: Subject to any disclaimer, the term of this patent is extended or adjusted under 35 U.S.C. 154(b) by 169 days.

(21) Appl. No.: 18/419,735

(22) Filed: Jan. 23, 2024

(65) Prior Publication Data

US 2025/0236210 A1 Jul. 24, 2025

(51) Int. Cl.
*B60L 58/26* (2019.01)
*B60L 58/25* (2019.01)
(Continued)

(52) U.S. Cl.
CPC ............... *B60L 58/26* (2019.02); *B60L 58/25* (2019.02); *B60W 60/001* (2020.02); *G07C 5/008* (2013.01); *H01M 10/613* (2015.04); *H01M 10/625* (2015.04); *H01M 10/6563* (2015.04); *H05K 7/20909* (2013.01);
(Continued)

(58) Field of Classification Search
CPC ...... B60L 58/26; B60L 58/25; B60L 2240/36; B60L 2240/662; B60W 60/001; B60W 2510/246; G07C 5/008; H01M 10/613; H01M 10/625; H01M 10/6563; H01M 2220/20; H05K 7/20909; H05K 7/20945
See application file for complete search history.

(56) References Cited

U.S. PATENT DOCUMENTS 4,222,032 A 9/1980 Speer
4,698,615 A 10/1987 Wilber
(Continued)

FOREIGN PATENT DOCUMENTS

CN 107415651 A 12/2017
CN 216069578 U 3/2022
(Continued)

OTHER PUBLICATIONS

"Katock, S; Eswaramoorthy M; A Detailed Review on Electric Vehicles Battery Thermal Management System; 2020; IOP conference series: materials science and engineering" (Year: 2020).*

*Primary Examiner* — Ramya P Burgess
*Assistant Examiner* — Christopher R Cardimino
(74) *Attorney, Agent, or Firm* — Frank Lollo; Eversheds Sutherland (US) LLP

(57) ABSTRACT

An electrified vehicle includes an electric power supply such as a battery or a DC power converter which may need to be cooled during a time when the vehicle is parked. A thermal transfer unit is coupled to the electric power supply. A cover sensor is configured to detect a cover disposed on the electric vehicle while being parked which impedes the thermal transfer unit, and a controller. When the cover is detected, the controller is configured to (A) determine a power supply temperature of the electric power supply, (B) compare the determined power supply temperature to a predetermined temperature threshold to detect an unfavorable condition, and (C) transmit an advisory signal to a user that the cover should be removed when the unfavorable condition is detected.

19 Claims, 4 Drawing Sheets

(51) Int. Cl.

| | |
|---|---|
| ***B60W 60/00*** | (2020.01) |
| ***G07C 5/00*** | (2006.01) |
| ***H01M 10/613*** | (2014.01) |
| ***H01M 10/625*** | (2014.01) |
| ***H01M 10/6563*** | (2014.01) |
| ***H05K 7/20*** | (2006.01) |

(52) U.S. Cl.

CPC ... *H05K 7/20945* (2013.01); *B60W 2510/246* (2013.01); *H01M 2220/20* (2013.01)

(56) References Cited

U.S. PATENT DOCUMENTS

| | | | | |
|---|---|---|---|---|
| 9,827,846 | B2 * | 11/2017 | Porras | B60K 11/085 |
| 10,099,532 | B2 | 10/2018 | Zhu et al. | |
| 10,328,782 | B2 * | 6/2019 | Sajedi | B60J 11/04 |
| 10,913,360 | B2 * | 2/2021 | Gaither | B60L 58/13 |
| 2012/0302149 | A1 * | 11/2012 | Zhu | H01M 8/04014 454/75 |
| 2015/0149043 | A1 * | 5/2015 | Macfarlane | B60K 11/085 701/49 |
| 2015/0354847 | A1 * | 12/2015 | Breu | F24F 11/38 165/11.1 |
| 2017/0368908 | A1 | 12/2017 | Cervantes et al. | |
| 2018/0224861 | A1 * | 8/2018 | Dudar | F02M 25/0836 |
| 2019/0272687 | A1 * | 9/2019 | Dudar | F01P 5/043 |
| 2020/0318584 | A1 * | 10/2020 | Clark | F02M 35/024 |
| 2021/0291640 | A1 * | 9/2021 | Srivastava | B60K 11/085 |
| 2021/0370753 | A1 * | 12/2021 | Stephens | B60J 11/02 |
| 2021/0387528 | A1 * | 12/2021 | Thompson | B60L 1/006 |
| 2021/0402849 | A1 * | 12/2021 | Choi | B60H 1/00885 |
| 2023/0373350 | A1 | 11/2023 | Farhat et al. | |
| 2024/0109420 | A1 * | 4/2024 | Neely | H01M 10/486 |
| 2024/0391341 | A1 * | 11/2024 | Zhu | B60L 58/24 |

FOREIGN PATENT DOCUMENTS

| | | | | |
|---|---|---|---|---|
| CN | 114709516 | A | 7/2022 | |
| DE | 102016006542 | A1 * | 12/2016 | F01P 11/14 |
| EP | 0861749 | A2 | 2/1998 | |
| GB | 2508796 | A * | 6/2014 | B60H 1/00407 |
| KR | 20130079053 | A | 7/2013 | |

* cited by examiner

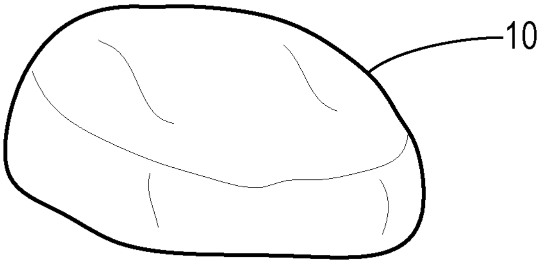
Fig. 1
Fig. 2
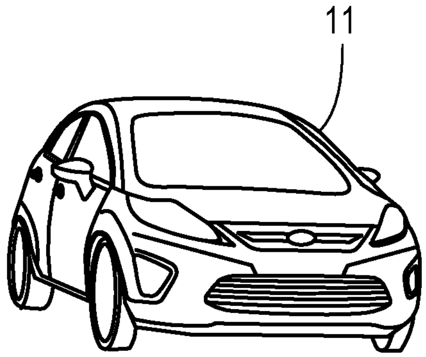
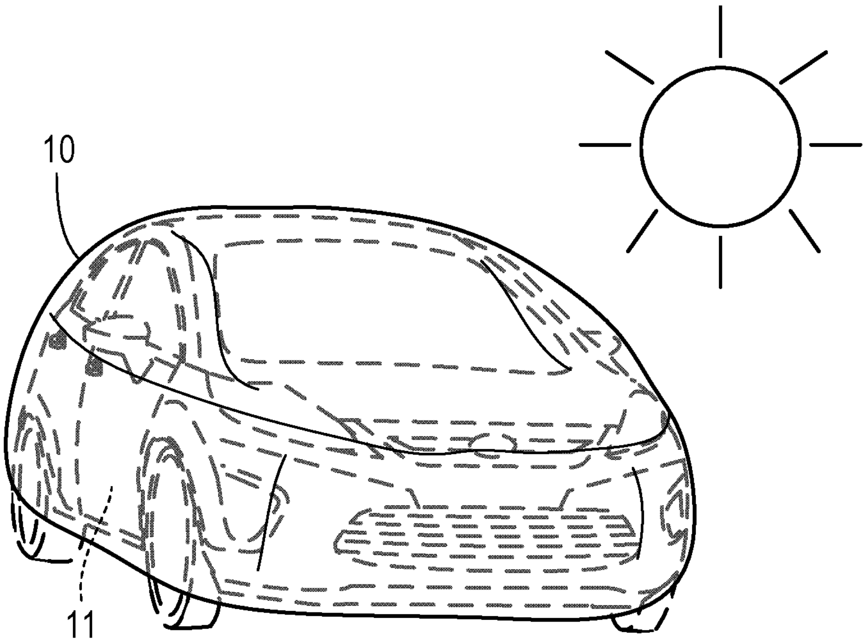
Fig. 3

TEMPERATURE CONTROL FOR ELECTRIC VEHICLE COMPONENTS WHILE PARKED

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to electrified vehicles, and, more specifically, to cooling/ventilation systems which may be operable during parking of a vehicle to cool a battery and/or power supply electronics.

Electrified vehicles or EVs (e.g., battery electric vehicles and hybrid electric vehicles) typically include a high voltage battery pack that supplies electrical power to one or more traction motors. Even while parked, the battery or battery pack may experience elevated temperatures which may have built up during driving or which may occur as a result of the use of power by auxiliary systems which become active during parking. Heat may also accumulate as a result of current flow while the battery pack is being recharged.

An EV may also include power converters or inverters which convert a high DC voltage of the battery pack (e.g., 800V) to a lower DC or AC voltage (e.g., 12V DC or 120V AC) for use while the vehicle is driven or parked. A power converter or inverter may likewise be utilized to generate an auxiliary power output for powering electrical accessories during a parked state of the vehicle, which may also lead to heat generation within the electrical power supplies (e.g., batteries, converters, or inverters). Consequently, cooling may be needed while the EV is parked.

For cooling of the power supplies, an EV may utilize fans, radiators, thermoelectric devices, or other apparatus to maintain temperature within a desired range. Heat which is removed from the battery or electronics must be dissipated outside the vehicle. Thus, an airflow must typically be maintained between the vehicle and the outside environment.

The need for cooling may be the greatest when the outside temperature is already elevated (e.g., due to bright sunshine). Under these conditions, the likelihood may also be elevated that a user may want to place a cover over the vehicle to shield it from bright sunshine and to insulate the EV from the warm outside environment. A protective cover can also be disposed on a vehicle for extended periods and under variable weather conditions. Such a cover may be waterproof and breathable (i.e., able to release water vapor). However, application of such a cover may interfere with airflow needed to cool the EV while parked, especially since the cover may block the end of an airflow channel or duct where the airflow exits the vehicle body.

SUMMARY OF THE INVENTION

In one aspect of the invention, an electric vehicle comprises an electric power supply, a thermal transfer unit coupled to the electric power supply, a cover sensor configured to detect a cover disposed on the electric vehicle while being parked which impedes the thermal transfer unit, and a controller. When the cover is detected, the controller is configured to (A) determine a power supply temperature of the electric power supply, (B) compare the determined power supply temperature to a predetermined temperature threshold to detect an unfavorable condition, and (C) transmit an advisory signal to a user that the cover should be removed when the unfavorable condition is detected.

BRIEF DESCRIPTION OF THE DRAWINGS

FIG. 1 is a perspective view of a vehicle cover.

FIG. 2 is a perspective view of a vehicle.

FIG. 3 is a perspective view of a vehicle cover disposed of a vehicle to reduce Sun exposure.

DETAILED DESCRIPTION OF PREFERRED EMBODIMENTS

Figure 4:
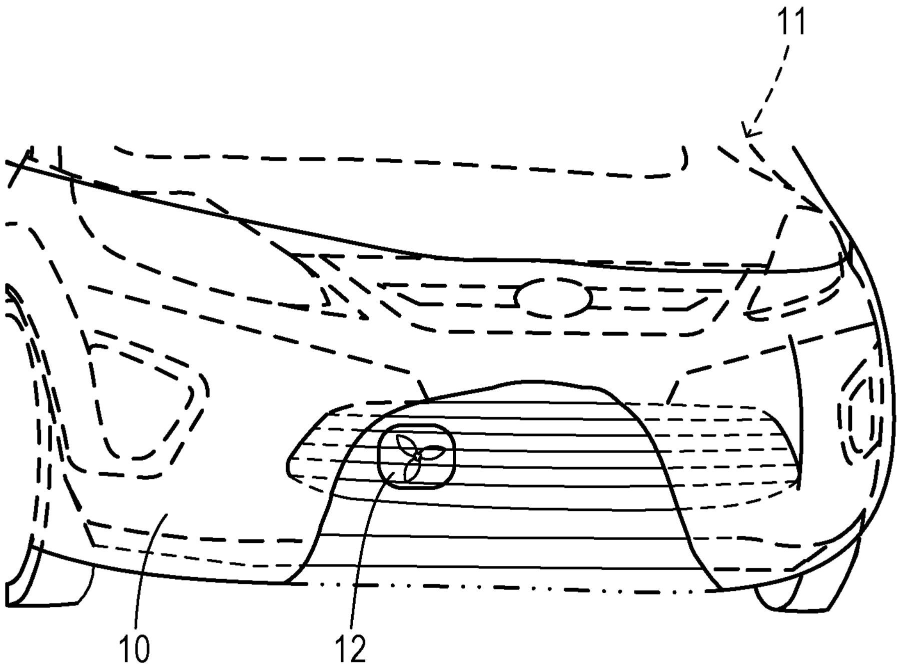
FIG. 4 is a partial cutaway view at a front grille of a vehicle where a cover impedes an airflow of a heat transfer unit.

Electrified vehicles typically utilize blower fans, radiators, and other heat transfer (e.g., cooling) mechanisms when the vehicle is shut off and parked in order to maintain an optimal battery temperature and optimal power converter temperature. This may include times when the battery pack is being charged and/or when a power converter or inverter is operating to support upfitter equipment on work sites.

Vehicles users sometimes want to place covers over their vehicles to protect them from the elements, e.g., for sun protection when overlanding and camping. Such placement of a cover may impede battery cooling due to inadequate airflow resulting in unfavorably elevated temperatures of the electric power supplies. To avoid these elevated temperatures, the invention may use various sensors (e.g., a fan sensor which may already be present for performing diagnostics including fan current or fan speed) to determine if airflow openings (e.g., radiator openings, duct openings, or grille openings) are free of obstructions before activating associated cooling components if the exterior conditions and/or electric power supply temperature necessitate this action.

In some embodiments, when the vehicle is keyed off (i.e., shut down), a determination may be made whether a currently measured power supply (battery or power converter/inverter) temperature or a current or predicted (future) ambient temperature or sunload may potentially drive the power supply temperature over a calibrated threshold in the event that a car cover wase to be used. For example, this determination can be based on a model using empirical data regarding how a battery temperature changes with key off in certain environmental conditions (e.g., based on geographic location and weather forecasts).

The vehicle can also map locations where covers are most likely to be installed based on expected sunload and/or ambient temperature in advance. If the current vehicle location corresponds to one of these locations (as determined by a location service such as GPS), the user can be advised not to install a car cover (or at least not to use a cover which does not provide a certain level of breathability or does not avoid covering a specific region of the vehicle).

Presence of a cover disposed on the vehicle may be detected using an exterior sensor suite which may include exterior or interior cameras. For example, when all cameras show at continuous single-colored region at the vehicle exterior and when all interior cameras show that all the windows are blocked, then a car cover is likely to be installed. Alternatively, a user input (e.g., a spoken command or a button press) can be used to determine if a car cover is installed. When necessary, a user can be informed via an audible tone or announcement and/or text message via an infotainment unit or other human machine interface. A user may be notified using wireless communication, such as a message sent from the vehicle to a mobile smartphone or other device executing a vehicle management app (e.g., Ford Pass® app).

When a car cover has been installed, but no one has responded to an advisory to remove it then the invention may further include the performance of mitigating actions. Mitigating actions may include seeking assistance from nearby people for help via audible requests. performing preventative cooling of the EV battery pack, running blower fans in reverse in an attempt to blow the obstructions out of the way, or autonomously moving the vehicle to a more favorable location (e.g., a shady spot). The mitigating action can include altering operation of the electric power supply to reduce a generation of heat. For example, a DC power converter can be switched to a lower output or fully deactivated (e.g., after notifying the user).

FIG. 1 shows a vehicle cover 10 which may be comprised of synthetic or natural fabrics. Cover 10 may be waterproof and adapted to reflect solar heat and radiation. The fabric may be "breathable" to allow moisture underneath cover 10 to evaporate. Such known fabrics, however, tend to limit airflow through cover 10 to less than what may be required in order for a battery cooling system to function properly, particularly in high ambient temperatures.

FIG. 2 shows an electrified vehicle (EV) 11. FIG. 3 shows cover 10 disposed on vehicle 11 to provide a barrier between an exterior surface of vehicle 11 and an external environment, thereby protecting vehicle 11 from precipitation and/or Sun exposure. The presence of cover 10, however, may impede airflow involved in thermal management (e.g., cooling) of electrical components that may be needed even when the vehicle is parked. As shown in FIG. 4, an airflow outlet 12 communicating via a front grille of vehicle 11 may be effectively blocked by cover 10 which may extend downward to completely contain the grille areas.

Figure 5:
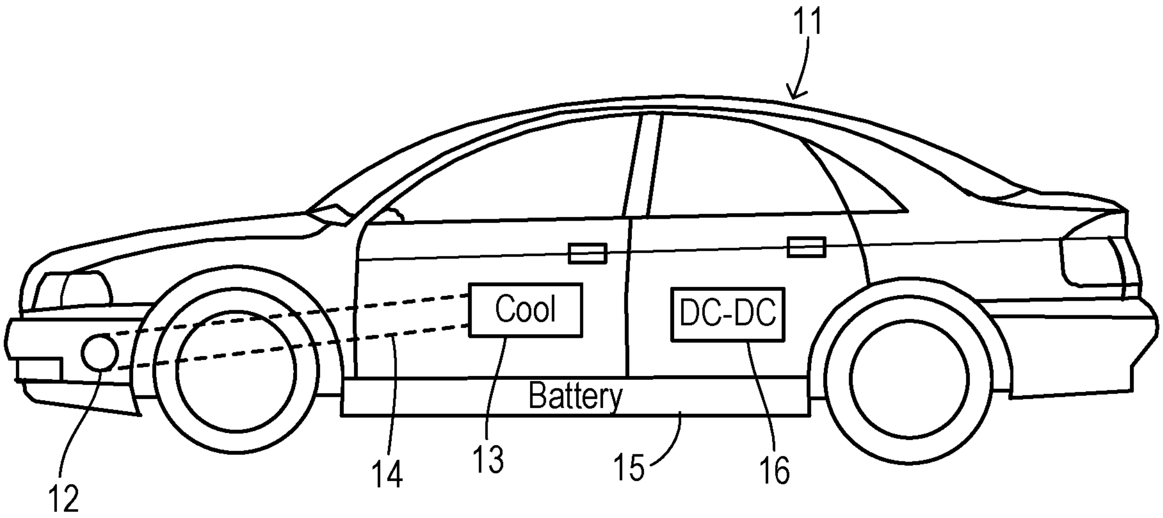
FIG. 5 is a side view of an electrified vehicle with a cooling system for cooling a battery pack and a DC-DC converter.

FIG. 5 shows vehicle 11 in greater detail. Airflow outlet 12 is coupled to a thermal transfer (e.g., cooling) unit 13 by a duct 14. Cooling unit 13 is arranged to cool a battery pack 15 and a DC-DC converter 16. Any kind of thermal transfer unit or HVAC components suitable for use in a vehicle can be utilized, such as evaporative air coolers (eAC), heat pumps, heat exchangers, and coolant-based units.

Figure 6:
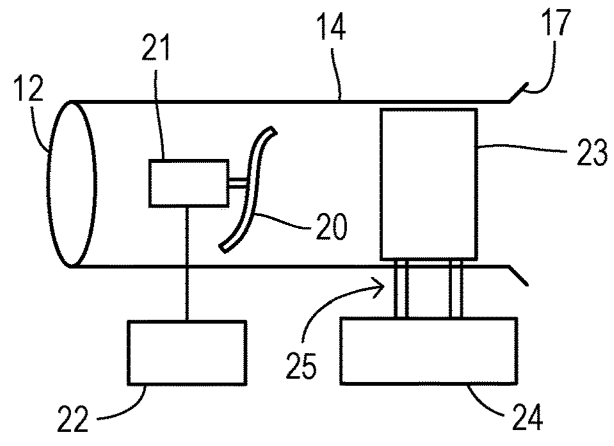
FIG. 6 is a schematic diagram of a portion of the cooling system of FIG. 5.
Figure 7:
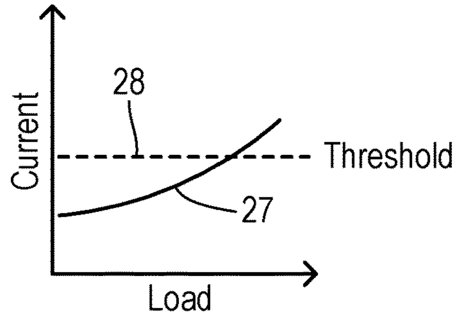
FIG. 7 is a graph showing changing motor current of a blower motor under changing loads due to impeded airflow.

One embodiment of cooling unit 13 is shown in greater detail in FIG. 6 including a blower fan 20 for driving an airflow through duct 14. Blower fan 20 is rotated by an electric motor 21 under control of a motor drive circuit 22. A radiator 23 is arranged in duct 14 between outlet 12 and an inlet 17. A compressor/evaporator 24 is in thermal communication with the electric power supply (e.g., battery or power converter) to transfer heat from the power supply to a refrigerant which carries the heat to radiator 23 via tubing 25. Airflow driven by blower fan 20 then conveys the heat to an external environment. When airflow in duct 14 is impeded by a cover obstructing outlet 12 or inlet 17, then a load upon electric motor 21 increases. As shown in FIG. 7, when the load increases the current drawn by motor 21 likewise increases along a curve 27. By comparing an instantaneous current along curve 27 with a motor current threshold 28, the presence of a cover can be inferred when an airflow blockage becomes sufficient to increase the motor load to the point where the motor current is above threshold 28.

Figure 8:
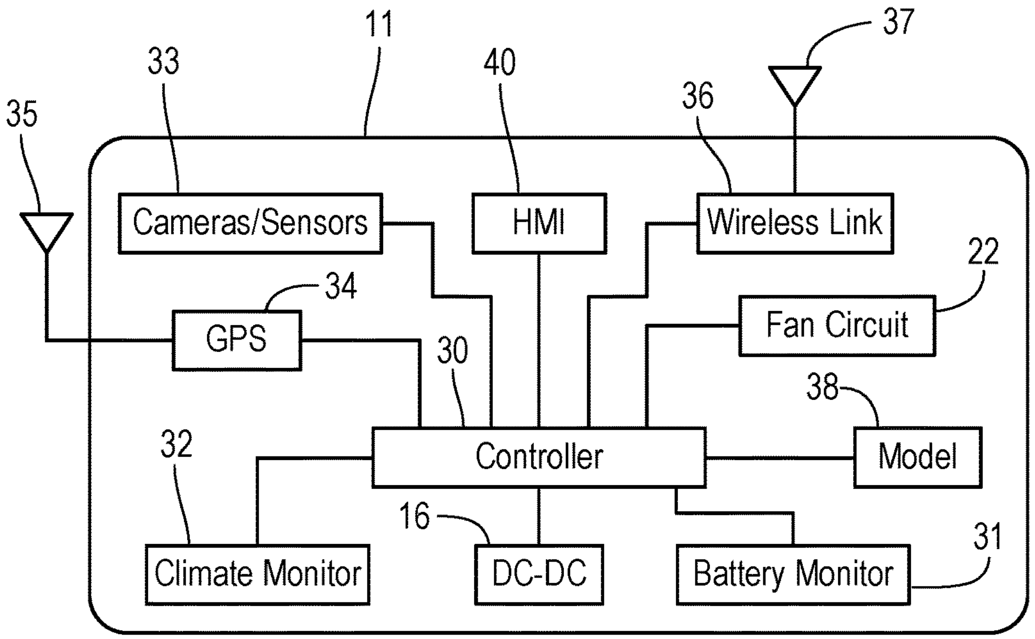
FIG. 8 is a block diagram showing a vehicle according to an embodiment of the invention.

FIG. 8 shows vehicle 11 in even greater detail. A controller 30 may be comprised of one or more programmable, general purpose electronic modules, such as a body control module (BCM). Controller 30 is coupled to a battery monitor 31 and a climate monitor 32 for gathering information used in the present invention. Battery monitor 31 may provide an instantaneous measured temperature of the battery pack to controller 30, for example. Climate monitor 32 may include a sensors for determining external ambient temperature and/or sunload conditions. Controller 30 is further coupled to DC-DC converter 16 in order to obtain instantaneous temperature information detected at converter 16. Controller 30 is further coupled to a sensor suite 33 which may include external and/or internal cameras and other sensors which may are configured to detect the presence of a cover disposed vehicle 11.

Controller 30 is coupled to a GPS receiver 34 with antenna 35 to obtain geographic coordinates for use in connection with determining weather forecasts or other climate-related information to predict a future temperature of the electric power supply, for example. Controller 30 is further coupled with a wireless link 36 with antenna 37 in order to collect external data including whether forecasts, future temperatures, or expected sunload based on geographic coordinates derived from GPS 34.

Controller 30 is further coupled to a fan circuit 22 in order to receive a measured motor current from a motor current sensor in fan circuit 22. Controller 30 compares measured motor current with a motor current threshold in order to detect when airflow resistance encountered by a blower fan is at a level which indicates that airflow is being impeded by a cover. Controller 30 may include data for a model 38 utilizing various remote and locally determined variables in order to predict future temperatures of the electric power supply and to identify unfavorable temperature conditions which may result from presence of the vehicle cover.

Controller 30 is coupled with an HMI human machine interface HMI 40 which may be configured to obtain inputs from a user to indicate the application of a cover (e.g. via button presses or reception of spoken commands). HMI 40 may further include a display screen and loudspeakers for transmitting advisory signals to the user when the cover should be removed and/or should not installed due to detection of an existing or expected unfavorable condition of the power supply temperature.

DC-DC converter 16 and a battery system can respond to controller 30 for altering their operation in order to reduce generation of heat as another mitigating action. Controller 30 may further include an autonomous powertrain controller function for moving vehicle 11 as a mitigating action. Furthermore, circuit 22 may be responsive to controller 34 operating the fan in a manner that repositions the cover or otherwise clears an impediment to the airflow (e.g. by reversing the direction of fan operation momentarily).

Figure 9:
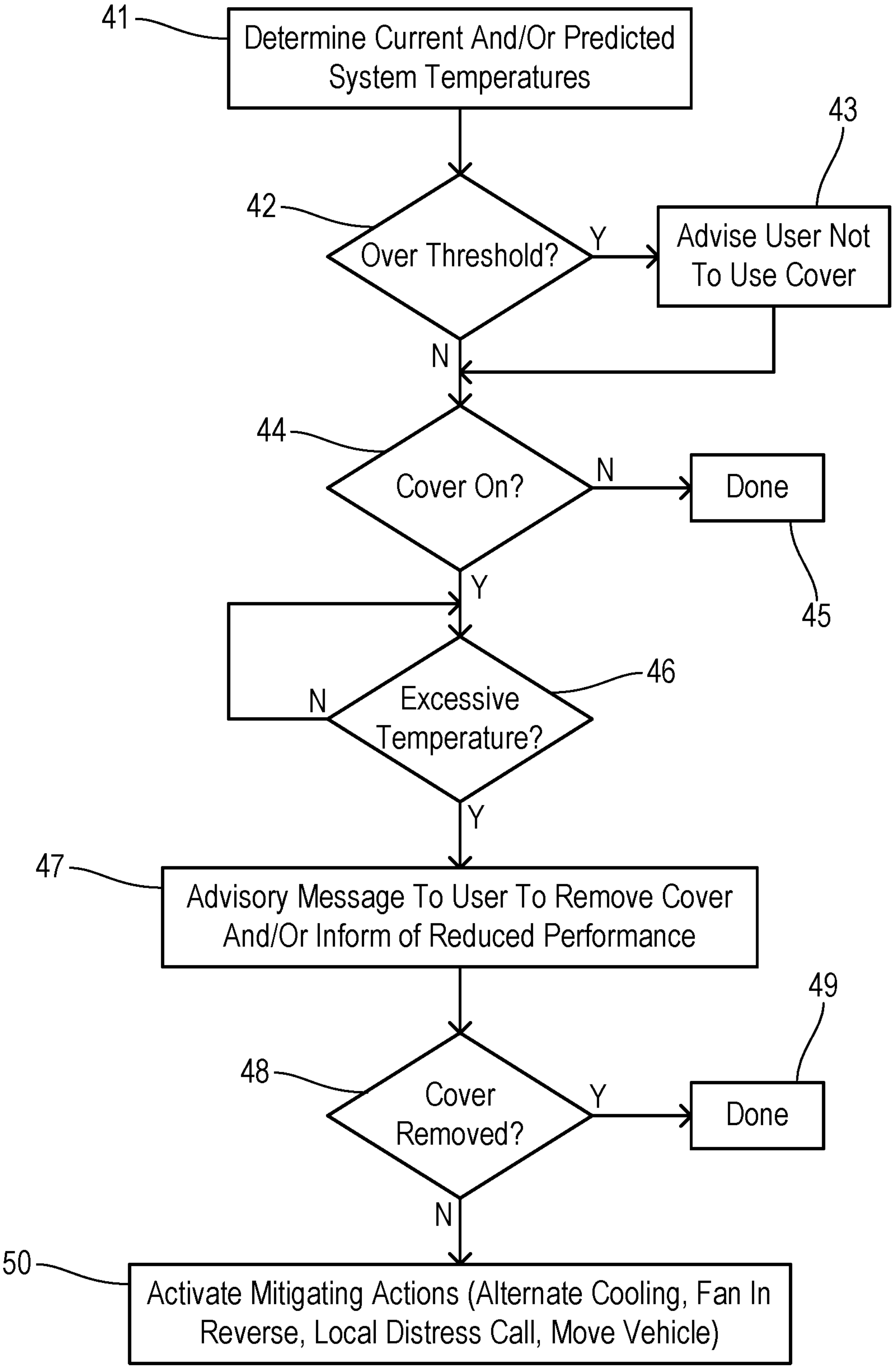
FIG. 9 is a flowchart showing an embodiment of a method of the invention.

FIG. 9 demonstrates an example method of the invention wherein current and/or predicted future temperatures of a power supply system are determined in step 41. A check is performed in step 42 to determine whether a measured/predicted temperature are within a temperature range indicative of an unfavorable condition (e.g., when a temperature is over a threshold, thereby indicating a need for cooling). If so, then the user is advised not to use a cover in step 43 by transmitting an advisory signal. After the advisory, or when the power supply temperature is determined to not exceed the temperature threshold, then a check is performed in step 44 to determine whether a cover has actually been put in place. If not, then the method may end at step 45.

In some embodiments, step 44 may be periodically performed in order to detect later application of a cover. Whenever step 44 determines that a cover has been disposed on the vehicle then a check is performed in step 46 to determine whether an excessive temperature (i.e., an unfavorable condition) has arisen in the electric power supply. If not, then step 46 may be periodically repeated to recheck the electric power supply temperature. If the power supply temperature exceeds the predetermined threshold in step 46, then an advisory message may be transmitted to the user in step 47, wherein the advisory message may suggest that the cover should be removed or inform the user that the operation of the power supply may be reduced in order to limit the amount of heat generated.

A check is performed in step 48 to determine whether the cover has been removed in compliance with an advisory message within a predetermined amount of time. If so, then the method completes at step 49. Otherwise, mitigating actions may be activated in step 50. As described above, the mitigating actions may include relocating the vehicle, initiating a local distress call via an audible signal to enlist a nearby person to remove the cover, operating the fan in reverse, or cooling the electric power supply by either altering its operation or finding an alternate means of cooling.

What is claimed is:

1. An electric vehicle comprising:

an electric power supply;

a thermal transfer unit coupled to the electric power supply;

a cover sensor configured to detect a protective cover disposed over an exterior surface of the electric vehicle while being parked which impedes the thermal transfer unit; and a controller configured to (A) determine, based on a signal obtained from the cover sensor, that the protective cover is disposed over the exterior surface of the electric vehicle, (B) determine a power supply temperature of the electric power supply, (C) compare the determined power supply temperature to a predetermined temperature threshold, (D) transmit an advisory signal to a user that the protective cover should be removed from the exterior surface of the electric vehicle when the power supply temperature exceeds the predetermined temperature threshold, (E) detect absence of a response from the user to the advisory signal, and (F) initiate one or more mitigating actions to reduce the power supply temperature, the one or more mitigating actions comprising operating a fan within the thermal transfer unit in a reverse direction to reposition the protective cover over the exterior surface of the electric vehicle.

2. The electric vehicle of claim 1, wherein the thermal transfer unit comprises a blower coupled to an air duct which directs an airflow outwardly from an exterior surface of the electric vehicle shrouded by the cover.

3. The electric vehicle of claim 2, wherein the blower comprises a fan, a motor coupled to the fan, and a motor drive circuit coupled to the motor, wherein the cover sensor is comprised of a motor current sensor, and wherein the cover is detected when a current measured by the motor current sensor is greater than a predetermined current threshold.

4. The electric vehicle of claim 2, wherein the thermal transfer unit further comprises a heat exchanger for actively altering a temperature of the airflow, and wherein the thermal transfer unit is comprised of at least one of an evaporative air cooler, heat pump, or coolant flow-based unit.

5. The electric vehicle of claim 1, wherein the cover sensor comprises at least one camera responsive to placement of the cover over the electric vehicle.

6. The electric vehicle of claim 1, wherein the cover sensor comprises a user input element configured for manual indication by a user installing the cover.

7. The electric vehicle of claim 1, wherein the advisory signal comprises a wireless message delivered to a mobile device of the user.

8. The electric vehicle of claim 1, wherein the advisory signal comprises an audible communication emitted by the electric vehicle.

9. The electric vehicle of claim 1, wherein the power supply temperature determined by the controller is an instantaneous temperature of the electric power supply.

10. The electric vehicle of claim 1, wherein the power supply temperature determined by the controller is a predicted future temperature of the electric power supply during a current parking event of the electric vehicle.

11. The electric vehicle of claim 1, wherein the electric power supply comprises at least one of a battery pack, a voltage converter, and a voltage inverter.

12. A method of controlling temperature of an electric power supply in an electric vehicle while parked, wherein the electric vehicle includes a thermal transfer unit coupled to the electric power supply and a cover sensor configured to detect a protective cover disposed over an exterior surface of the electric vehicle which impedes the thermal transfer unit, the method comprising the steps of:

determining, based on a signal obtained from the cover sensor, that the protective cover is disposed over the exterior surface of the electric vehicle;

determining a power supply temperature of the electric power supply;

comparing the determined power supply temperature to a predetermined temperature threshold;

detecting presence of the cover impeding the thermal transfer unit;

transmitting an advisory signal to a user that the protective cover should be removed from the exterior surface of the electric vehicle when the power supply temperature exceeds the predetermined temperature threshold;

detecting absence of a response from the user to the advisory signal; and initiating one or more mitigating actions to reduce the power supply temperature, the one or more mitigating actions comprising operating a fan within the thermal transfer unit in a reverse direction to reposition the protective cover over the exterior surface of the electric vehicle.

13. The electric vehicle of claim 1, wherein the fan is operated in the reverse direction momentarily to reposition the protective cover over the exterior surface of the electric vehicle.

14. The method of claim 12, wherein the fan is operated in the reverse direction momentarily to reposition the protective cover over the exterior surface of the electric vehicle.

15. The method of claim 12, wherein the thermal transfer unit comprises a fan, a motor coupled to the fan, and a motor drive circuit coupled to the motor, wherein the cover sensor is comprised of a motor current sensor, and wherein the step of detecting presence of the cover is comprised of detecting when a current measured by the motor current sensor is greater than a predetermined current threshold.

16. The method of claim 12, wherein the step of detecting presence of the cover is comprised of capturing images from at least one camera which are responsive to placement of the cover over the electric vehicle.

17. The method of claim 12, wherein the step of detecting presence of the cover is comprised of receiving a manual indication via a user input element from a user installing the cover.

18. The method of claim 12, wherein the advisory signal is comprised of at least one of a wireless message delivered to a mobile device of the user and an audible communication emitted by the electric vehicle.

19. The method of claim 12, wherein the power supply temperature is a predicted future temperature of the electric power supply during a current parking event of the electric vehicle.

* * * * *